US011785803B2

(12) United States Patent
Jang et al.

(10) Patent No.: US 11,785,803 B2
(45) Date of Patent: Oct. 10, 2023

(54) DISPLAY DEVICE

(71) Applicant: Samsung Display Co., Ltd., Yongin-si (KR)

(72) Inventors: Jaeyong Jang, Seoul (KR); Gyungsoon Park, Seoul (KR); Sunhwa Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 143 days.

(21) Appl. No.: 17/444,276

(22) Filed: Aug. 2, 2021

(65) Prior Publication Data
US 2022/0109030 A1  Apr. 7, 2022

(30) Foreign Application Priority Data

Oct. 7, 2020  (KR) .......................... 10-2020-0129706

(51) Int. Cl.
| | |
|---|---|
| *H01L 21/00* | (2006.01) |
| *H10K 59/121* | (2023.01) |
| *H10K 59/88* | (2023.01) |
| *H10K 59/131* | (2023.01) |
| *G09G 3/20* | (2006.01) |

(52) U.S. Cl.
CPC ........ *H10K 59/121* (2023.02); *H10K 59/131* (2023.02); *H10K 59/88* (2023.02); *G09G 3/20* (2013.01); *G09G 2300/0819* (2013.01); *G09G 2300/0842* (2013.01); *G09G 2320/0233* (2013.01)

(58) Field of Classification Search
CPC .................................................... H10K 59/121
See application file for complete search history.

(56) References Cited

FOREIGN PATENT DOCUMENTS

| KR | 10-2017-0062647 A | 6/2017 |
|---|---|---|
| KR | 10-2019-0079487 A | 7/2019 |
| KR | 10-2020-0115925 A | 10/2020 |
| WO | WO 2020/218704 A1 | 10/2020 |

*Primary Examiner* — Douglas M Menz
(74) *Attorney, Agent, or Firm* — Lewis Roca Rothgerber Christie LLP

(57) ABSTRACT

A display device includes: a substrate including a first display area, a second display area, and a third display area which are arranged along a row direction; a first pixel row on the substrate, extending in the row direction, and including first pixel circuit portions overlapping the second and third display areas; a second pixel row extending in the row direction and including second pixel circuit portions overlapping the second display area; display elements overlapping the first display area; and bridge lines adjacent to the second pixel circuit row, overlapping the second display area, and connecting the first pixel circuit portions and the display elements.

20 Claims, 11 Drawing Sheets

DISPLAY DEVICE

CROSS-REFERENCE TO RELATED APPLICATION

The present application claims priority to and the benefit of Korean Patent Application No. 10-2020-0129706, filed on Oct. 7, 2020, in the Korean Intellectual Property Office, the entire contents of which are hereby incorporated by reference.

BACKGROUND

1. Field

Aspects of some embodiments of the present invention relate generally to a display device.

2. Discussion of the Background

A display device generally includes pixel circuits, driving circuits, and display elements. The pixel circuits components and the driving circuit components may be formed using the same metal layers. In addition, portions of the pixel circuits may overlap a display area of the display device, and portions of the driving circuits may overlap a peripheral area of the display device. The display elements are located at the pixel circuits, and are located in the display area of the display device. The driving circuits provide driving signals to the pixel circuits, the pixel circuits provide driving currents to the display elements, and the display elements may generate light to display images. Efforts have been made to increase the display area in which the display elements are located.

The above information disclosed in this Background section is only for enhancement of understanding of the background and therefore the information discussed in this Background section does not necessarily constitute prior art.

SUMMARY

Aspects of some example embodiments according to the present disclosure include a display device.

Additional aspects and characteristics of some embodiments of the inventive concept will be set forth in the description which follows, and in part will be more apparent from the description, or may be learned by practice of the inventive concepts.

A display panel according to some embodiments includes: a substrate including a first display area, a second display area, a third display area, a fourth display area, and a fifth display area which are arranged in a row direction, a circuit layer on the substrate, and a display layer on the circuit layer. The circuit layer may include a plurality of pixel circuit rows extending in the row direction and arranged in a column direction, and the display layer may include a plurality of display element rows extending in the row direction and arranged in the column direction. Each of odd-numbered pixel circuit rows included in the pixel circuit rows may include first pixel circuit portions overlapping the second display area, and each of even-numbered pixel circuit rows included in the pixel circuit rows may include second pixel circuit portions overlapping the fourth display area.

According to some embodiments, the circuit layer may further include a first driving circuit portion overlapping the first display area, and each of odd-numbered display element rows included in the display element rows may include first display elements overlapping the first display area.

According to some embodiments, the first display elements may be connected to the first pixel circuit portions through first bridge lines, respectively.

According to some embodiments, the first bridge lines may overlap the second display area.

According to some embodiments, the first bridge lines may be adjacent to the even-numbered pixel circuit rows.

According to some embodiments, the circuit layer may further include a second driving circuit portion overlapping the fifth display area, and each of even-numbered display element rows included in the display element rows may include second display elements overlapping the fifth display area.

According to some embodiments, the second display elements may be connected to the second pixel circuit portions through second bridge lines, respectively.

According to some embodiments, the second bridge lines may overlap the fourth display area.

According to some embodiments, the second bridge lines may be adjacent to the odd-numbered pixel circuit rows.

According to some embodiments, each of the odd-numbered pixel circuit rows may further include third pixel circuit portions overlapping the third display area, and each of odd-numbered display element rows included in the display element rows may include third display elements overlapping the third display area.

According to some embodiments, the third display elements may be connected to the third pixel circuit portions, respectively.

According to some embodiments, each of the even-numbered pixel circuit rows may further include fourth pixel circuit portions overlapping the third display area, and each of even-numbered display element rows included in the display element rows may include fourth display elements overlapping the third display area.

According to some embodiments, the fourth display elements may be connected to the fourth pixel circuit portions, respectively.

According to some embodiments, the circuit layer may further include a plurality of gate lines connected between the first driving circuit portion and the second driving circuit portion.

According to some embodiments, the gate lines may provide gate signals to the pixel circuit rows.

According to some embodiments, the circuit layer may further include first dummy circuit portions included in each of the odd-numbered pixel circuit rows and second dummy circuit portions included in each of the even-numbered pixel circuit rows.

According to some embodiments, the first dummy circuit portions may overlap the fourth display area, and the second dummy circuit portions may overlap the second display area.

According to some embodiments, the gate lines may provide gate signals to the first dummy circuit portions and second dummy circuit portions.

A display panel according to some embodiments includes: a substrate including a first display area, a second display area, and a third display area which are arranged in a row direction, a first pixel row on the substrate, extending in the row direction, and including first pixel circuit portions overlapping the second and third display areas, a second pixel row extending in the row direction and including second pixel circuit portions overlapping the second display area, display elements overlapping the first display area, and bridge lines adjacent to the second pixel circuit row, overlapping the second display area, and connecting the first pixel circuit portions and the display elements.

According to some embodiments, the display may further include a driving circuit portion on the substrate and overlapping the first display area, and the display elements may be on the driving circuit portion.

Therefore, a display device according to some embodiments may include a circuit layer and a display layer on the circuit layer. The circuit layer may include pixel circuit rows and driving circuit portions, and the display layer may include display element rows. The driving circuit portions and the display element rows may overlap each other in first and fifth display areas of the display device. Accordingly, the display area of the display device can be increased.

In addition, the pixel circuit rows may include odd-numbered pixel circuit rows and even-numbered pixel circuit rows. The odd-numbered pixel circuit row may include a first pixel circuit portion overlapping a second display area (e.g., left side of the third display area), and the even-numbered pixel circuit row may include a second pixel circuit portion overlapping a fourth display area (e.g., right side of the third display area). The first pixel circuit portion may be connected to the first display element through the first bridge line, and the second pixel circuit portion may be connected to the second display element through the second bridge line. On the left side of the odd-numbered pixel circuit row, a first coupling phenomenon may occur between the driving circuit portion and the first display element, and on the right side of the odd-numbered pixel circuit row, the second coupling phenomenon may occur between the second bridge line and the gate line. In addition, the second coupling phenomenon may occur on the left side of the even-numbered pixel circuit row, and the first coupling phenomenon may occur on the right side of the even-numbered pixel circuit row. Accordingly, a deviation between the parasitic capacitance of the gate line in the odd-numbered pixel circuit row and the parasitic capacitance of the gate line in the even-numbered pixel circuit row may be reduced. Accordingly, a difference in luminance between the luminance of the odd-numbered pixel circuit rows and the luminance of the even-numbered pixel circuit rows may be reduced, and accordingly, a defect that is perceived by horizontal lines on the display device may be improved.

It is to be understood that both the foregoing general description and the following detailed description provide examples, are explanatory, and are intended to provide further explanation of the invention according to the appended claims and their equivalents.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION

Figure 1:
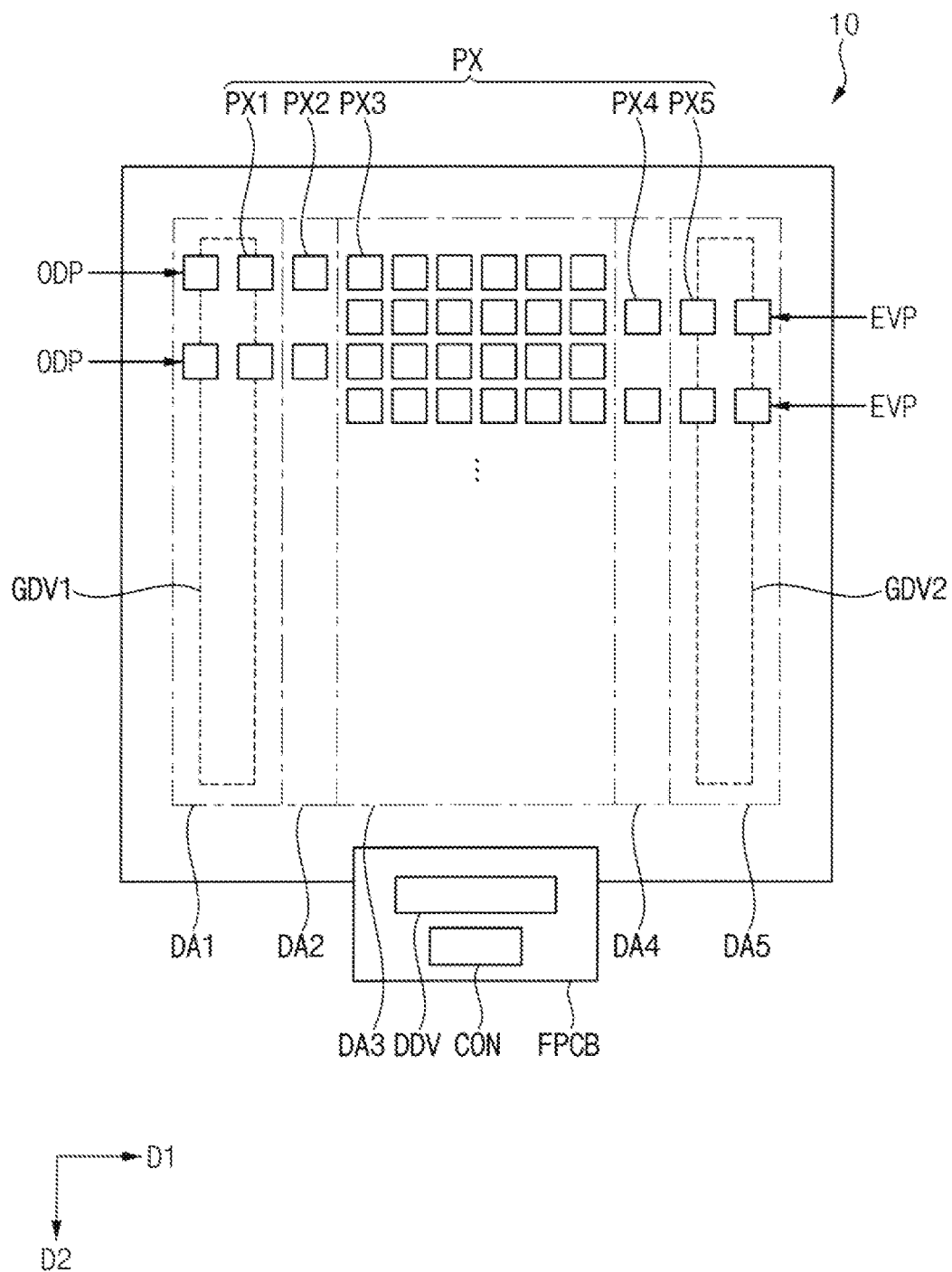
FIG. 1 is a plan view illustrating a display device according to some embodiments.

In the following description, for the purposes of explanation, numerous specific details are set forth in order to provide a more thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are illustrated in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Illustrative, non-limiting example embodiments will be more clearly understood from the following detailed description in conjunction with the accompanying drawings.

Figure 2:
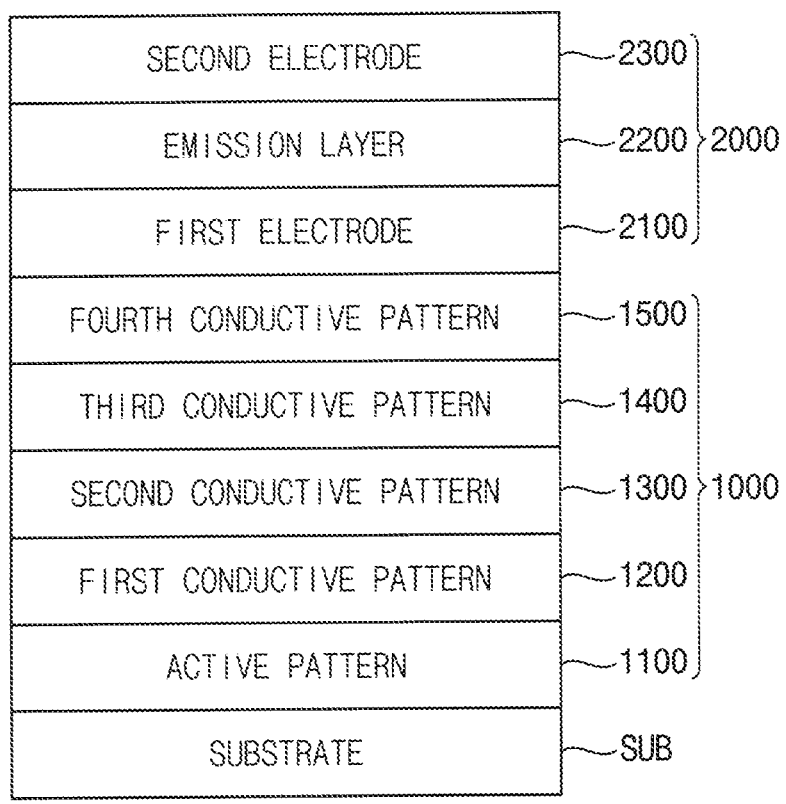
FIG. 2 is a cross-sectional view illustrating an example of a stacked structure of the display device of FIG. 1 according to some embodiments.
Figure 3:
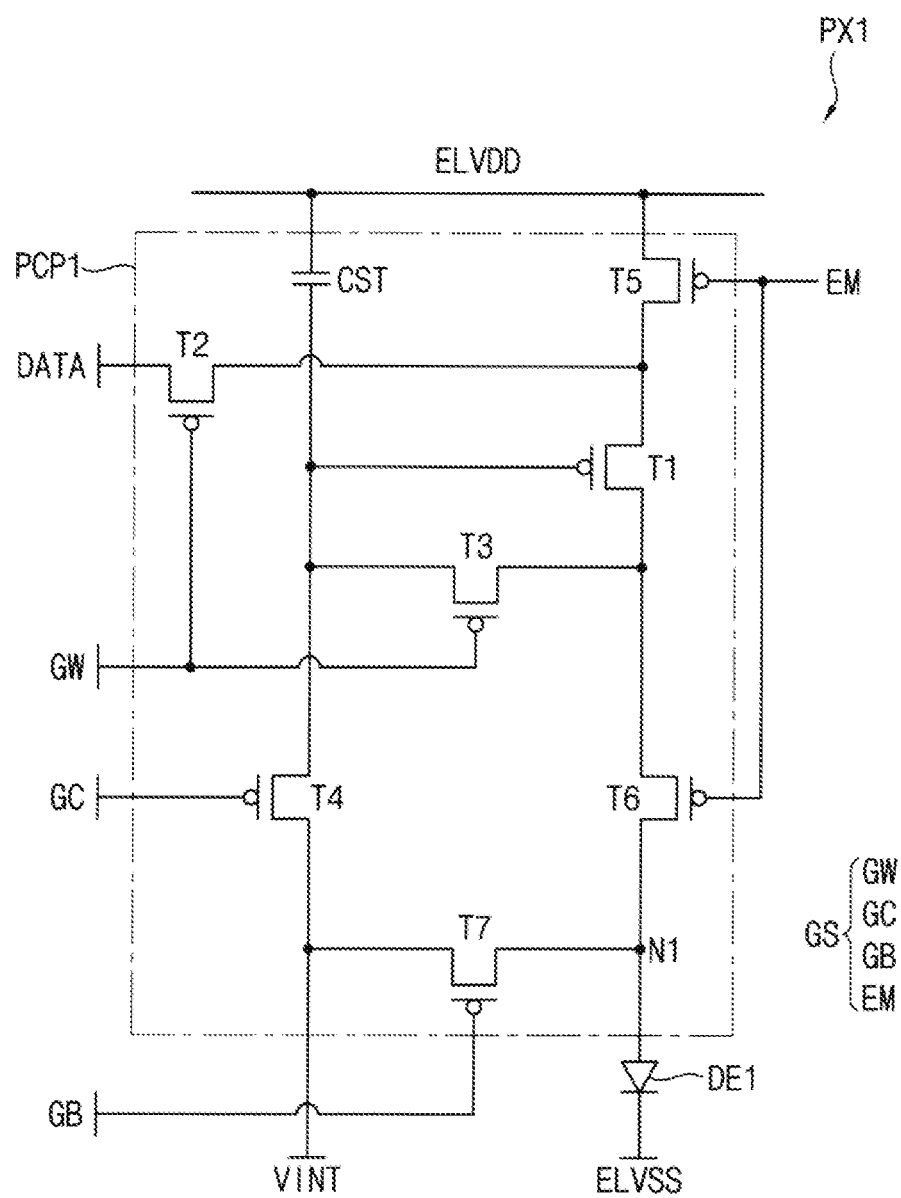
FIG. 3 is a circuit diagram illustrating an example of pixel circuit portion and display element included in the display device of FIG. 1 according to some embodiments.

FIG. 1 is a plan view illustrating a display device according to some embodiments. FIG. 2 is a cross-sectional view illustrating an example of a stacked structure of the display device of FIG. 1. FIG. 3 is a circuit diagram illustrating an example of pixel circuit portion and display element included in the display device of FIG. 1.

Referring to FIGS. 1 and 2, a display device 10 according to some embodiments may include a substrate SUB, a circuit layer 1000, and a display layer 2000.

The substrate SUB may include first to fifth display areas DA1, DA2, DA3, DA4, and DA5. The first to fifth display areas DA1, DA2, DA3, DA4, and DA5 may be arranged side by side in a first direction D1. In addition, each of the first to fifth display areas DA1, DA2, DA3, DA4, and DA5 may extend in a second direction D2 orthogonal to the first direction D1. For example, the first direction D1 may be a row direction, and the second direction D2 may be a column direction.

The circuit layer 1000 may be located on the substrate SUB. The circuit layer 1000 may include a plurality of pixel circuit portions (e.g., pixel circuit portions PCP of FIG. 4) and driving circuit portions. According to some embodiments, the pixel circuit portions PCP may overlap the second to fourth display areas DA2, DA3, and DA4, and the driving circuit portions may overlap the first and fifth display areas DA1 and DA5.

The pixel circuit portions PCP may receive driving signals from the driving circuit portions. For example, the driving signals may be a gate signal GS, a data voltage DATA, or the like. For example, the gate signal GS may include a first gate signal GW, a second gate signal GC, a third gate signal GB, and an emission control signal EM. The pixel circuit portions PCP may provide driving currents to the display layer 2000 through bridge lines.

The display layer 2000 may be located on the circuit layer 1000. The display layer 2000 may overlap the first to fifth display areas DA1, DA2, DA3, DA4, and DA5. The display layer 2000 may include a plurality of display elements (e.g., display elements DE of FIG. 5). In other words, the display elements DE may overlap the first to fifth display areas DA1, DA2, DA3, DA4, and DA5. The display elements DE may receive the driving currents from the pixel circuit portions PCP. The display elements DE may generate light having luminance according to the driving currents.

The driving circuit portions may provide the driving signals to the pixel circuit portions PCP. According to some embodiments, the driving circuit portions may include a first gate driver GDV1, a second gate driver GDV2, a data driver DDV, and a controller CON. The first gate driver GDV1 may provide the gate signal to the pixel circuit portions PCP. The second gate driver GDV2 may provide the gate signal or the emission control signal to the pixel circuit portions PCP. The data driver DDV may provide the data voltage DATA to the pixel circuit portions PCP. The controller CON may control the first gate driver GDV1, the second gate driver GDV2, and the data driver DDV. For example, the first and second gate drivers GDV1 and GDV2 may be formed on the substrate SUB and may be included in the circuit layer 1000. The data driver DDV and the controller CON may be formed on a flexible printed circuit board FPCB located on the substrate SUB.

The pixel circuit portions PCP and the display elements DE electrically connected to the pixel circuit portions PCP may constitute pixels PX. For example, the first pixel circuit portion PCP1 and the first display element DE1 electrically connected to the first pixel circuit portion PCP1 may constitute a first pixel PX1.

The pixels PX may be arranged in a matrix structure on the substrate SUB. For example, the pixels PX may be classified as a first pixel PX1 overlapping (or located within) the first display area DA1, a second pixel PX2 overlapping (or located within) the second display area DA2, a third pixel PX3 overlapping (or located within) the third display area DA3, a fourth pixel PX4 overlapping (or located within) the fourth display area DA4, and a fifth pixel PX5 overlapping (or located within) the fifth display area DA5. The number of display areas according to embodiments of the present disclosure are not limited to the number illustrated in FIG. 1, however, and some embodiments may include additional display areas or fewer display areas without departing from the spirit and scope of embodiments according to the present disclosure.

Further, a plurality of pixel rows may be defined, and the pixel rows may be divided into odd-numbered pixel row ODP and even-numbered pixel row EVP. The odd-numbered pixel row ODP may include an odd-numbered pixel circuit row (e.g., an odd-numbered pixel circuit row OPC of FIG. 4) and an odd-numbered display element row (e.g., an odd-numbered display element row ODE of FIG. 5). For example, the pixel circuit portions PCP located in the odd-numbered pixel circuit row OPC and the display elements DE located in the odd-numbered display element row ODE may constitute pixels located in the odd-numbered pixel row ODP. In addition, the even-numbered pixel row EVP may include an even-numbered pixel circuit row (e.g., an even-numbered pixel circuit row EPC in FIG. 4) and an even-numbered display element row (e.g., even-numbered display element row EDE of FIG. 5). For example, the pixel circuit portions PCP located in the even-numbered pixel circuit row EPC and the display elements DE located in the even-numbered display element row EDE may constitute pixels located in the even-numbered pixel row EVP.

As shown in FIG. 2, the display device 10 may have a structure in which the substrate SUB, the circuit layer 1000, and the display layer 2000 are sequentially stacked. For example, the circuit layer 1000 may be formed by stacking an active pattern 1100, a first conductive pattern 1200, a second conductive pattern 1300, a third conductive pattern 1400, and a fourth conductive pattern 1500. In addition, the display layer 2000 may be formed by stacking a first electrode 2100, an emission layer 2200, and a second electrode 2300. Accordingly, the circuit layer 1000 and the display layer 2000 may overlap the first to fifth display areas DA1, DA2, DA3, DA4, and DA5. For example, the first and second gate drivers GDV1 and GDV2 and the display layer 2000 may overlap each other in the first and fifth display areas DA1 and DA5.

Referring to FIG. 3, the first pixel PX1 may generate light through the first pixel circuit portion PCP1 and the first display element DE1. In addition, each of the second to fifth pixels PX2, PX3, PX4, and PX5 may have substantially the same connection structure as the first pixel PX1. Hereinafter, a connection structure between the first pixel circuit portion PCP1 and the first display element DE1 constituting the first pixel PX1 will be described.

According to some embodiments, the first pixel circuit portion PCP1 may include a plurality of transistors and at least one storage capacitor, as illustrated in FIG. 3, although embodiments according to the present disclosure are not necessarily limited to the number, configuration, and type of component illustrated in FIG. 3, and some embodiments may include additional components, fewer components, or components with a different arrangement without departing from the spirit and scope of embodiments according to the present disclosure.

According to some embodiments, for example, the first pixel circuit portion PCP1 includes a first transistor T1, a second transistor T2, a third transistor T3, a fourth transistor T4, a fifth transistor T5, a sixth transistor T6, a seventh transistor T7, and a storage capacitor CST. The first transistor T1 may be referred to as a driving transistor, the second transistor T2 may be referred to as a switching transistor, the third transistor T3 may be referred to as a compensation transistor, the fourth transistor T4 may be referred to as an initialization transistor, the fifth and sixth transistors T5 and T6 may be referred to as emission control transistors, and the seventh transistor T7 may be referred to as an anode initialization transistor.

The first transistor T1 may include a gate terminal, a first terminal (e.g., a source terminal), and a second terminal (e.g., a drain terminal). The gate terminal of the first transistor T1 may be connected to the storage capacitor CST. The first terminal of the first transistor T1 may receive a high power voltage EVLDD. The second terminal of the first transistor T1 may be connected to the sixth transistor T6. The first transistor T1 may generate the driving current based on the high power voltage ELVDD and the data voltage DATA.

The second transistor T2 may include a gate terminal, a first terminal (e.g., a source terminal), and a second terminal (e.g., a drain terminal). The gate terminal of the second transistor T2 may receive the first gate signal GW through a gate line. The first terminal of the second transistor T2 may receive the data voltage DATA. The second terminal of the second transistor T2 may provide the data voltage DATA to the first transistor T1.

The second transistor T2 may be turned on or off in response to the first gate signal GW. For example, when the second transistor T2 is a PMOS transistor, the second transistor T2 may be turned off when the first gate signal GW has a positive voltage level, and the may be turn on when the first gate signal GW has a negative voltage level.

The third transistor T3 may include a gate terminal, a first terminal (e.g., a source terminal), and a second terminal (e.g., a drain terminal). The gate terminal of the third transistor T3 may receive the first gate signal GW. The first terminal of the third transistor T3 may be connected to the second terminal of the first transistor T1, and the second terminal of the third transistor T3 may be connected to the gate terminal of the first transistor T1.

The third transistor T3 may be turned on or off in response to the first gate signal GW. For example, when the third transistor T3 is a PMOS transistor, the third transistor T3 may be turned on when the first gate signal GW has a negative voltage level, and may be turn off when the first gate signal GW has a positive voltage level. During a period in which the third transistor T3 is turned on in response to the first gate signal GW, the third transistor T3 may diode-connect the first transistor T1. Accordingly, the third transistor T3 may compensate for the threshold voltage of the first transistor T1.

The fourth transistor T4 may include a gate terminal, a first terminal (e.g., a source terminal), and a second terminal (e.g., a drain terminal). The gate terminal of the fourth transistor T4 may receive the second gate signal GC. The fourth transistor T4 may transmit an initialization voltage VINT to the gate terminal of the first transistor T1.

The fourth transistor T4 may be turned on or off in response to the second gate signal GC. For example, when the fourth transistor T4 is a PMOS transistor, the fourth transistor T4 may be turned on when the second gate signal GC has a negative voltage level, and may be turn off when the second gate signal GC has a positive voltage level.

While the fourth transistor T4 is turned on in response to the second gate signal GC, the initialization voltage VINT may be provided to the gate terminal of the first transistor T1. Accordingly, the gate terminal of the first transistor T1 may be initialized to the initialization voltage VINT.

The fifth transistor T5 may include a gate terminal, a first terminal (e.g., a source terminal), and a second terminal (e.g., a drain terminal). The gate terminal of the fifth transistor T5 may receive the emission control signal EM. The first terminal of the fifth transistor T5 may receive the high power voltage ELVDD. The second terminal of the fifth transistor T5 may be connected to the first transistor T1. When the fifth transistor T5 is turned on in response to the emission control signal EM, the fifth transistor T5 may provide the high power voltage ELVDD to the first transistor T1.

The sixth transistor T6 may include a gate terminal, a first terminal (e.g., a source terminal), and a second terminal (e.g., a drain terminal). The gate terminal of the sixth transistor T6 may receive the emission control signal EM. The first terminal of the sixth transistor T6 may be connected to the first transistor T1. The second terminal of the sixth transistor T6 may be connected to the first display element DE1. When the sixth transistor T6 is turned on in response to the emission control signal EM, the sixth transistor T6 may transmit the driving current to the first display element DE1 through a first node N1.

The seventh transistor T7 may include a gate terminal, a first terminal (e.g., a source terminal), and a second terminal (e.g., a drain terminal). The gate terminal of the seventh transistor T7 may receive the third gate signal GB. The second terminal of the seventh transistor T7 may receive the initialization voltage VINT. The first terminal of the seventh transistor T7 may be connected to the first display element DE1. When the seventh transistor T7 is turned on in response to the third gate signal GB, the seventh transistor T7 may provide the initialization voltage VINT to the first display device DE1. Accordingly, the seventh transistor T7 may initialize the first terminal of the first display element DE1 to the initialization voltage VINT.

The storage capacitor CST may include a first terminal and a second terminal. The first terminal of the storage capacitor CST may be connected to the first transistor T1, and the second terminal of the storage capacitor CST may receive the high power voltage ELVDD. The storage capacitor CST may maintain the voltage level of the gate terminal of the first transistor T1 during an inactive period of the first gate signal GW.

The first display element DE1 may include a first terminal (e.g., an anode terminal) and a second terminal (e.g., a cathode terminal). The first terminal of the first display element DE1 may receive the driving current, and the second terminal may receive the low power voltage ELVSS. The first display device DE1 may generate light having a luminance corresponding to the driving current.

Figure 4:
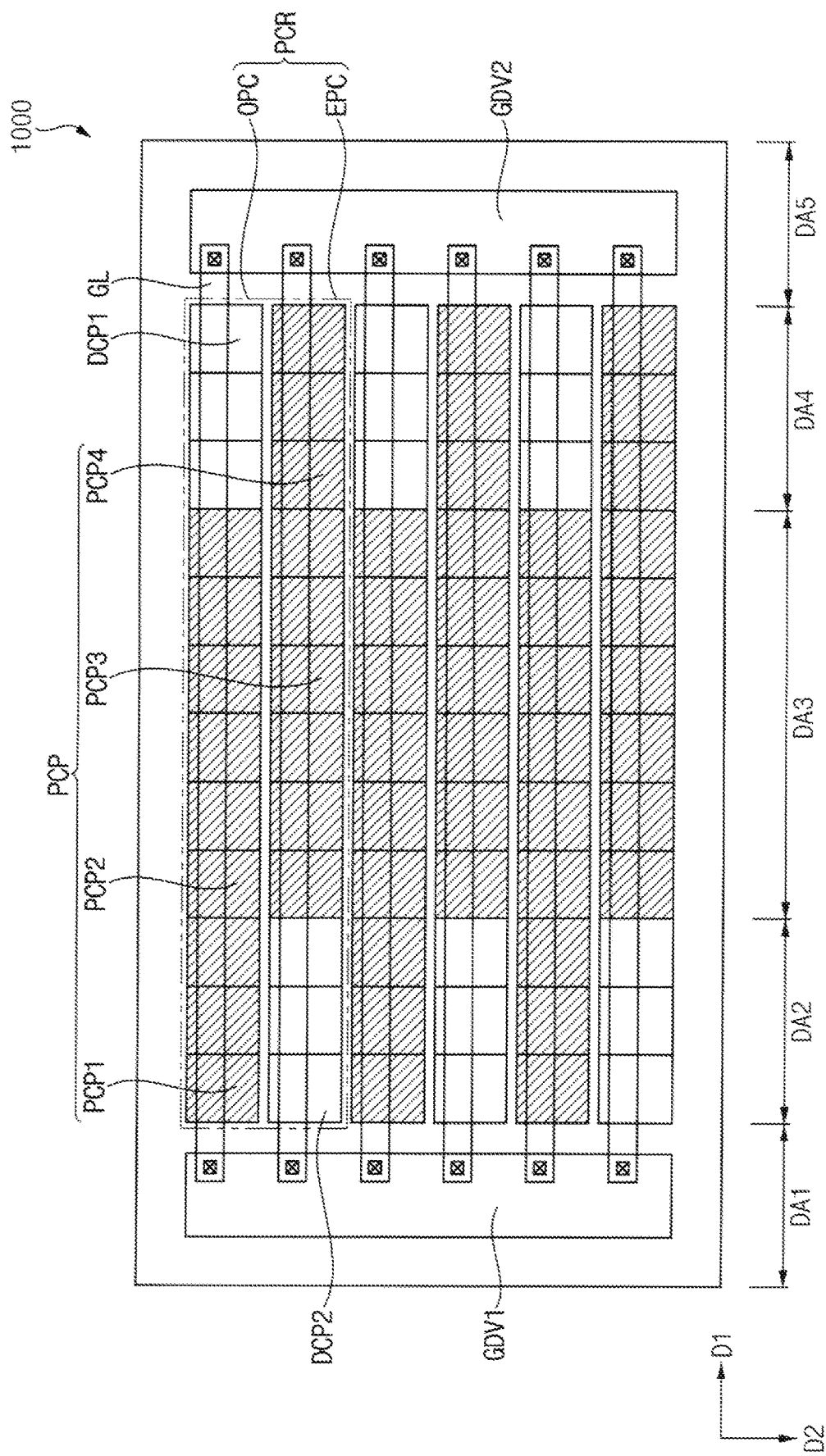
FIG. 4 is a plan view illustrating an example of a circuit layer included in the display device of FIG. 1 according to some embodiments.
Figure 5:
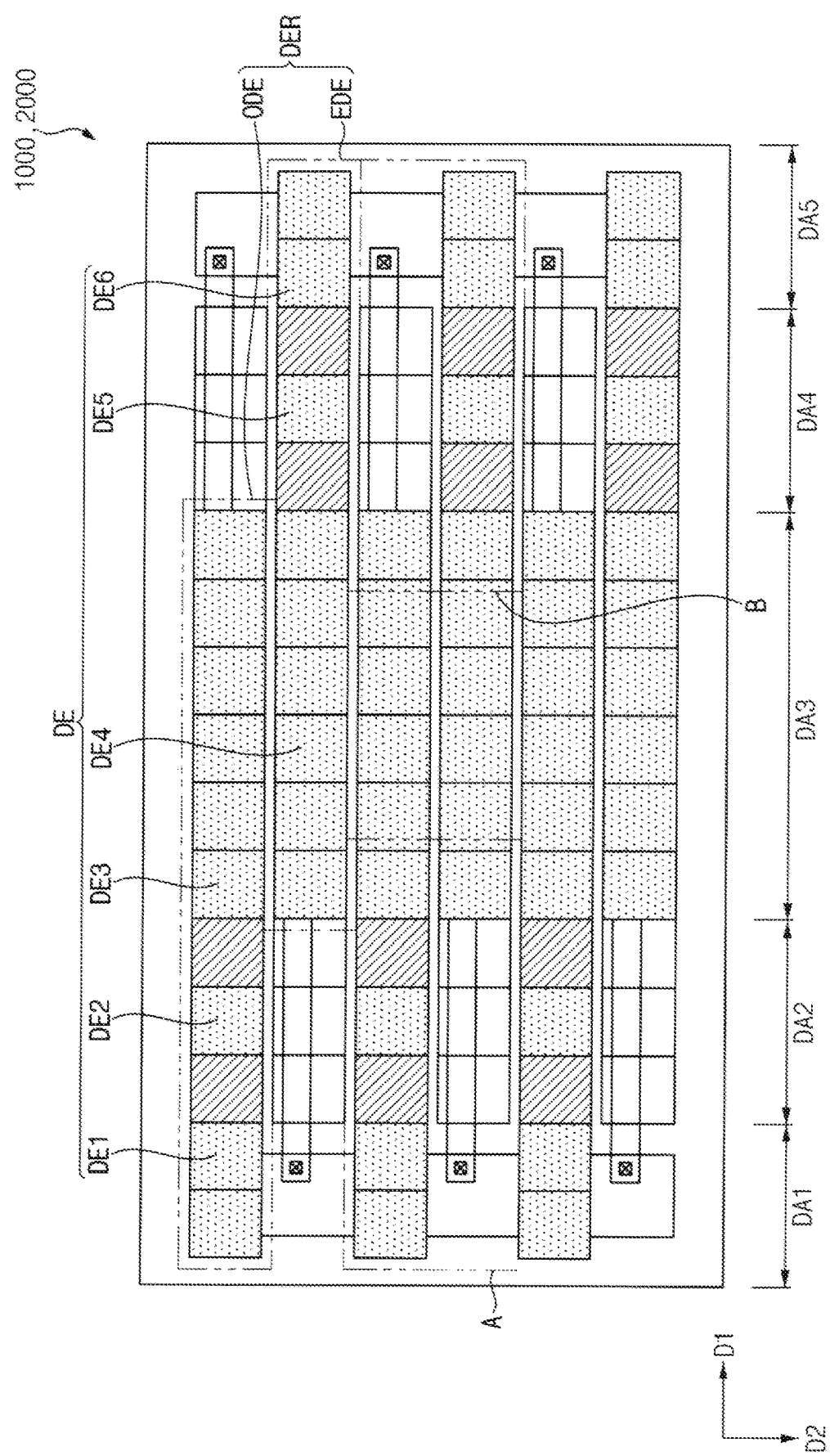
FIG. 5 is a plan view illustrating an example of a circuit layer and a display layer included in the display device of FIG. 1 according to some embodiments.

FIG. 4 is a plan view illustrating an example of a circuit layer included in the display device of FIG. 1. FIG. 5 is a plan view illustrating an example of a circuit layer and a display layer included in the display device of FIG. 1.

Referring to FIG. 4, the circuit layer 1000 may include a pixel circuit row PCR, a first gate driver GDV1, and a second gate driver GDV2.

The pixel circuit rows PCR may be located on the substrate SUB and may overlap the second to fourth display areas DA2, DA3, and DA4. The pixel circuit rows PCR may have a repetitive structure. For example, the pixel circuit rows PCR may extend in the first direction D1 and may be arranged in the second direction D2.

The pixel circuit row PCR may include an odd-numbered pixel circuit row OPC and an even-numbered pixel circuit row EPC. The odd-numbered pixel circuit row OPC may include a first pixel circuit portion PCP1, a second pixel circuit portion PCP2, and a first dummy circuit portion DCP1. The first pixel circuit portion PCP1 may overlap the second display area DA2. The second pixel circuit portion PCP2 may overlap the third display area DA3. The first dummy circuit portion DCP1 may overlap the fourth display area DA4. The first and second pixel circuit portions PCP1 and PCP2 may be connected to display elements, and the first dummy circuit portion DCP1 may not be connected to the display element. In addition, the even-numbered pixel circuit row EPC may include a third pixel circuit portion PCP3, a fourth pixel circuit portion PCP4, and a second dummy circuit portion DCP2. The third pixel circuit portion PCP3 may overlap the third display area DA3. The fourth pixel circuit portion PCP4 may overlap the fourth display area DA4. The second dummy circuit portion DCP2 may overlap the second display area DA2. The third and fourth pixel circuit portions PCP3 and PCP4 may be connected to display elements, and the second dummy circuit portion DCP2 may not be connected to the display element.

The first gate driver GDV1 may overlap the first display area DA1, and the second gate driver GDV2 may overlap the fifth display area DA5. According to some embodiments, the circuit layer 1000 may further include a plurality of gate lines GL connected between the first and second gate drivers GDV1 and GDV2. The gate lines GL extend in the first direction D1 and may be arranged in the second direction D2. The gate line GL may extend through the pixel circuit portions PCP and may provide the gate signal to the pixel circuit portions PCP. In addition, although FIG. 4 illustrates that one gate line GL is located in one pixel circuit row PCR, the number of gate lines GL is not limited thereto. For example, a plurality of gate lines GL may be located in one pixel circuit row PCR.

Referring to FIG. 5, the display layer 2000 may include display element rows DER.

The display element rows DER may be located on the circuit layer 1000 and may overlap with the first to third display areas DA1, DA2, and DA3, or the third to fifth display areas DA3, DA4, DA5. The display element rows DER may have a repetitive structure. For example, the display element rows DER may extend in the first direction D1 and may be arranged in the second direction D2.

The display element row DER may include an odd-numbered display element row ODE and an even-numbered display element row EDE. The odd-numbered display element row ODE may include a first display element DE1, a second display element DE2, and a third display element DE3. The first display element DE1 may overlap the first display area DA1. The second display element DE2 may overlap the second display area DA2. The third display element DE3 may overlap the third display area DA3. In addition, the even-numbered display element row EDE may include a fourth display element DE4, a fifth display element DE5, and a sixth display element DE6. The fourth display element DE4 may overlap the third display area DA3. The fifth display element DE5 may overlap the fourth display area DA4. The sixth display element DE6 may overlap the fifth display area DA5.

Figure 6:
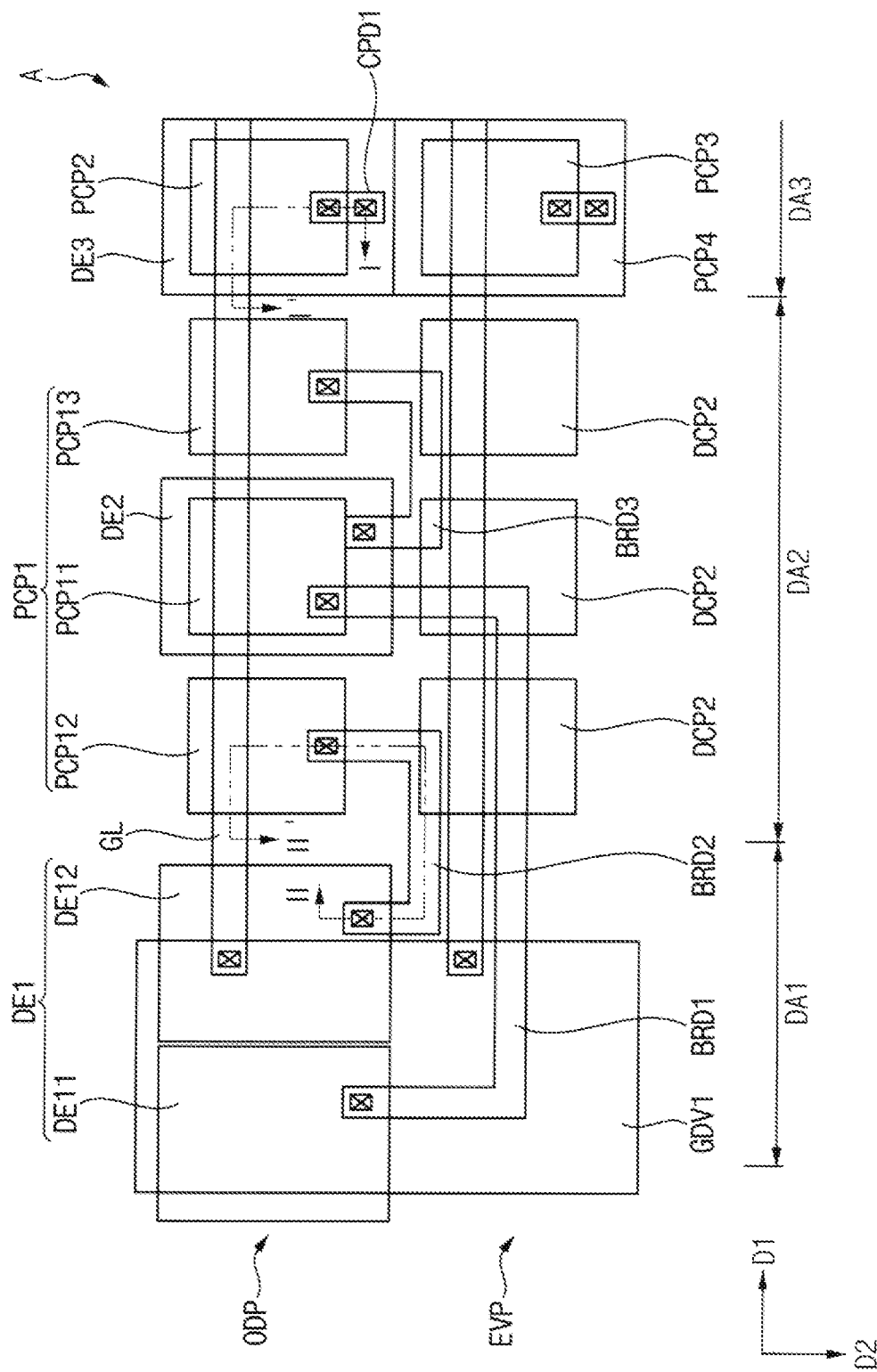
FIG. 6 is an enlarged view of the area A of FIG. 5 according to some embodiments.
Figure 7:
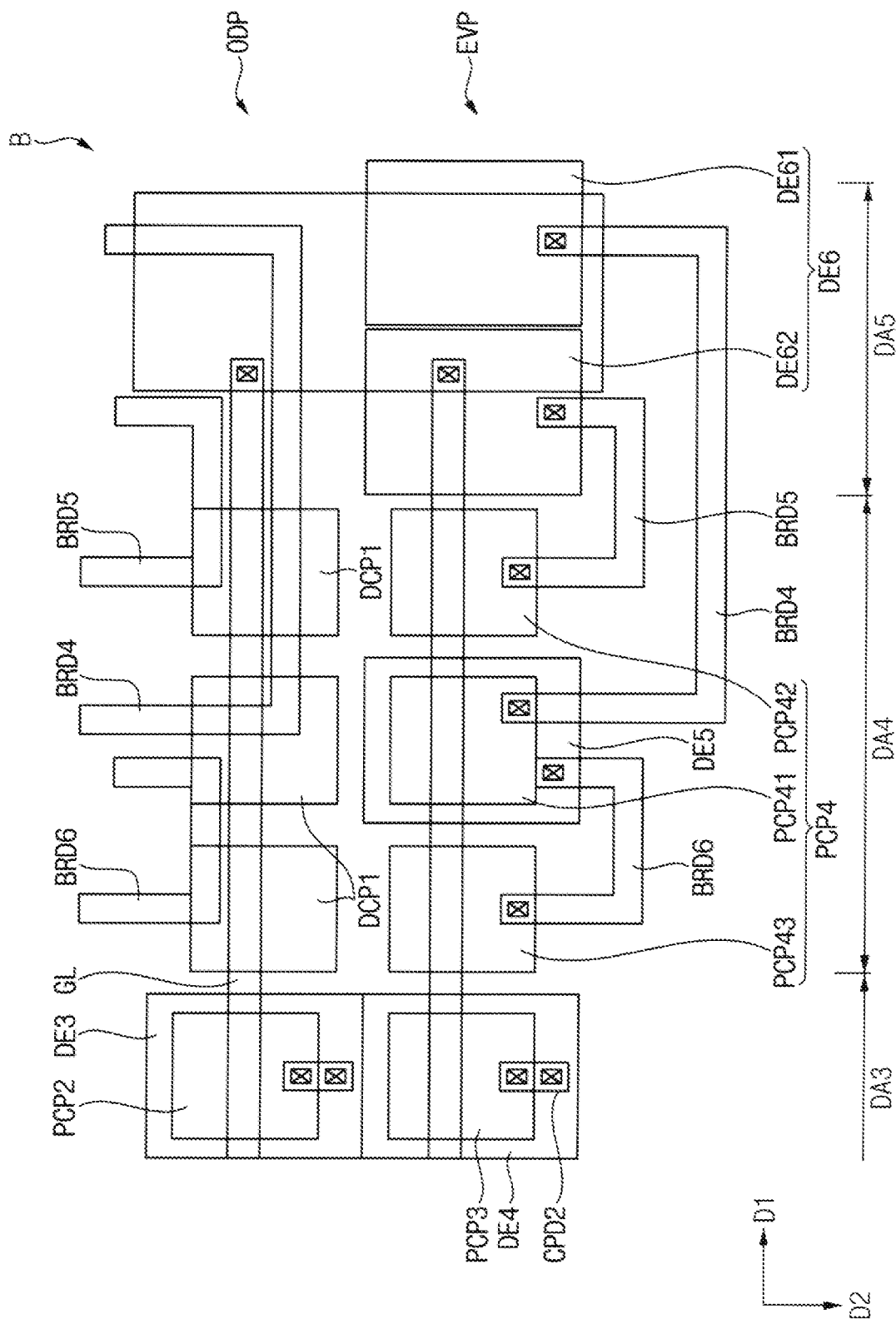
FIG. 7 is an enlarged view of the area B of FIG. 5 according to some embodiments.

FIG. 6 is an enlarged view of the area A of FIG. 5. FIG. 7 is an enlarged view of the area B of FIG. 5. For example, FIG. 6 is an enlarged view illustrating an odd-numbered pixel row and an even-numbered pixel row arranged on the left side of the display device and FIG. 7 is an enlarged view illustrating an odd-numbered pixel row and an even-numbered pixel row arranged on the right side of the display device.

Referring to FIG. 6, the pixel circuit portions PCP may be connected to the display elements DE through the bridge lines.

For example, the second pixel circuit portion PCP2 may be connected to the third display element DE3 through a first connection pad CPD1. Each of the bridge lines may have substantially the same configuration as the first connection pad CPD1. In other words, the first connection pad CPD1 and the bridge lines may correspond to the first node N1 shown in FIG. 3. However, while the first connection pad CPD1 connects the second pixel circuit part PCP2 and the third display element DE3 overlapping each other, the bridge line may connect the pixel circuit portion and the display element that do not overlap each other.

For example, the first bridge line BRD1 may connect the first pixel circuit portion PCP11 and the first display element DE11 to each other. The second bridge line BRD2 may connect the first pixel circuit portion PCP12 and the first display element DE12 to each other. The third bridge line BRD3 may connect the first pixel circuit portion PCP13 and the second display element DE2 to each other. Accordingly, the driving current may be transmitted through each of the first to third bridge lines BRD1, BRD2, and BRD3. Accordingly, a driving voltage corresponding to the driving current may be applied to each of the first to third bridge lines BRD1, BRD2, and BRD3.

According to some embodiments, the first to third bridge lines BRD1, BRD2, and BRD3 may overlap the first and second display areas DA1 and DA2. In addition, the first to third bridge lines BRD1, BRD2, and BRD3 may be adjacent to the even-numbered pixel row EVP. In other words, the first to third bridge lines BRD1, BRD2, and BRD3 may be adjacent to the even-numbered pixel circuit row EPC.

Referring to FIG. 7, the pixel circuit portions PCP may be connected to the display elements DA through bridge lines.

For example, the third pixel circuit portion PCP3 may be connected to the fourth display element DE4 through a second connection pad CPD2. Each of the bridge lines may have substantially the same configuration as the second connection pad CPD2. However, while the second connection pad CPD2 connects the third pixel circuit portion PCP3 and the fourth display element DE4 overlapping each other, the bridge line may connect the pixel circuit portion and the display element that do not overlap each other.

For example, the fourth bridge line BRD4 may connect the fourth pixel circuit portion PCP41 and the sixth display element DE61. The fifth bridge line BRD5 may connect the fourth pixel circuit portion PCP42 and the sixth display element DE62. The sixth bridge line BRD6 may connect the fourth pixel circuit portion PCP43 and the fifth display element DE5. Accordingly, the driving current may be transmitted through each of the fourth to sixth bridge lines BRD4, BRD5, and BRD6. Accordingly, a driving voltage corresponding to the driving current may be applied to each of the fourth to sixth bridge lines BRD4, BRD5, and BRD6.

According to some embodiments, the fourth to sixth bridge lines BRD4, BRD5, and BRD6 may overlap the fourth and fifth display areas DA4 and DA5. In addition, the fourth to sixth bridge lines BRD4, BRD5, and BRD6 may be adjacent to the odd-numbered pixel row ODP. In other words, the fourth to sixth bridge lines BRD4, BRD5, and BRD6 may be adjacent to the odd-numbered pixel circuit row OPC.

Referring back to FIGS. 6 and 7, a first coupling phenomenon between the first gate driver GDV1 and the first display element DE1 may occur on the left side of the odd-numbered pixel circuit row ODP. A second coupling phenomenon may occur between the gate line GL and the fourth to sixth bridge lines BRD4, BRD5, and BRD6 on the right side of the odd-numbered pixel circuit row ODP. In addition, the second coupling phenomenon may occur between the gate line GL and the first to third bridge lines BRD1, BRD2, and BRD3 on the left side of the even pixel circuit row EVP. The first coupling phenomenon may occur between the second gate driver GDV2 and the sixth display element DE6 on the right side of the even-numbered pixel circuit row EVP. In other words, the first coupling phenomenon and the second coupling phenomenon may occur in the odd-numbered pixel circuit row ODP, and the first coupling phenomenon and the second coupling phenomenon may occur in the even-numbered pixel circuit row EVP. Accordingly, a deviation between a parasitic capacitance of the gate line GL located in the odd-numbered pixel circuit row ODP and a parasitic capacitance of the gate line GL located in the even-numbered pixel circuit row EVP may be reduced. In addition, by arranging dummy circuit portions under the bridge lines, the second coupling phenomenon may be suppressed. Accordingly, a deviation between the parasitic capacitance of the gate line GL located in the odd-numbered pixel circuit row ODP and the parasitic capacitance of the gate line GL located in the even-numbered pixel circuit row EVP may be further reduced.

Figure 8:
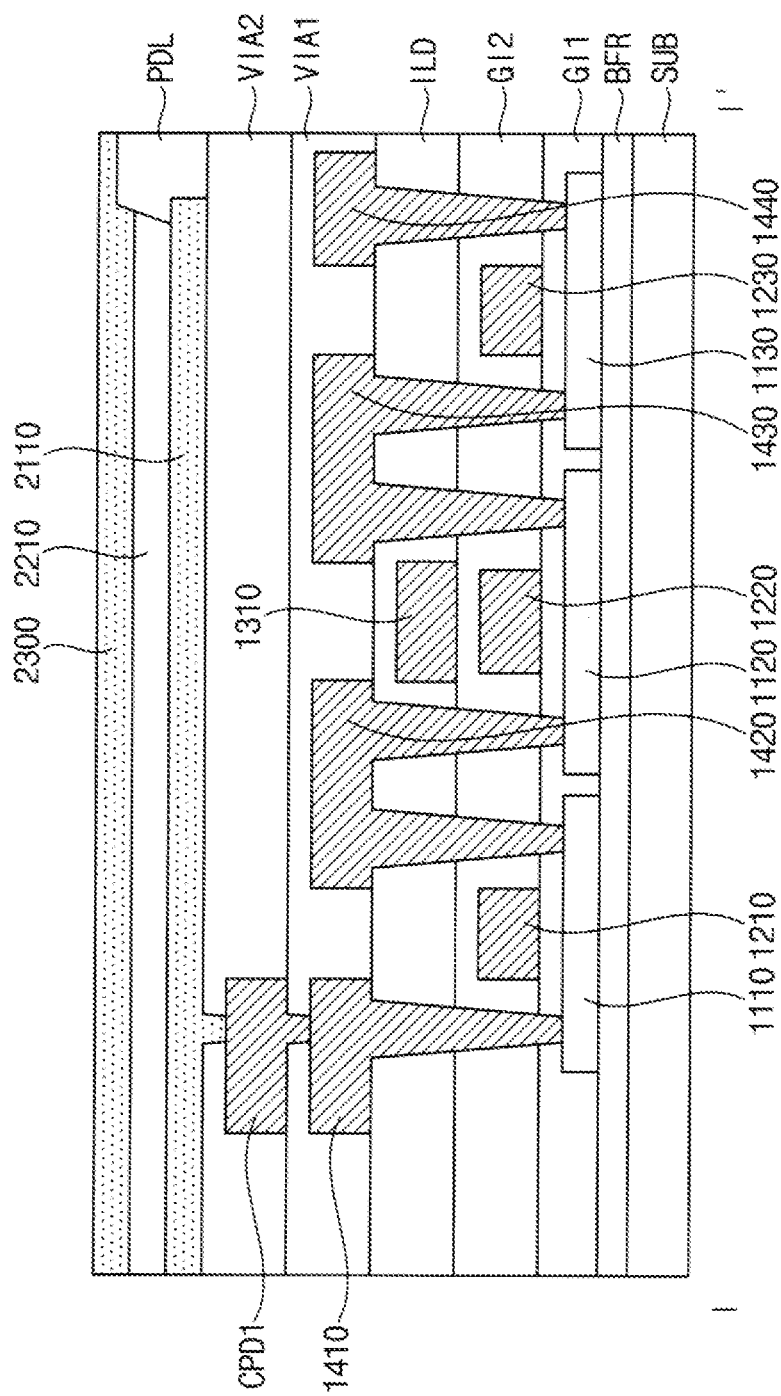
FIG. 8 is a cross-sectional view taken along the line I-I' of FIG. 6 according to some embodiments.
Figure 9:
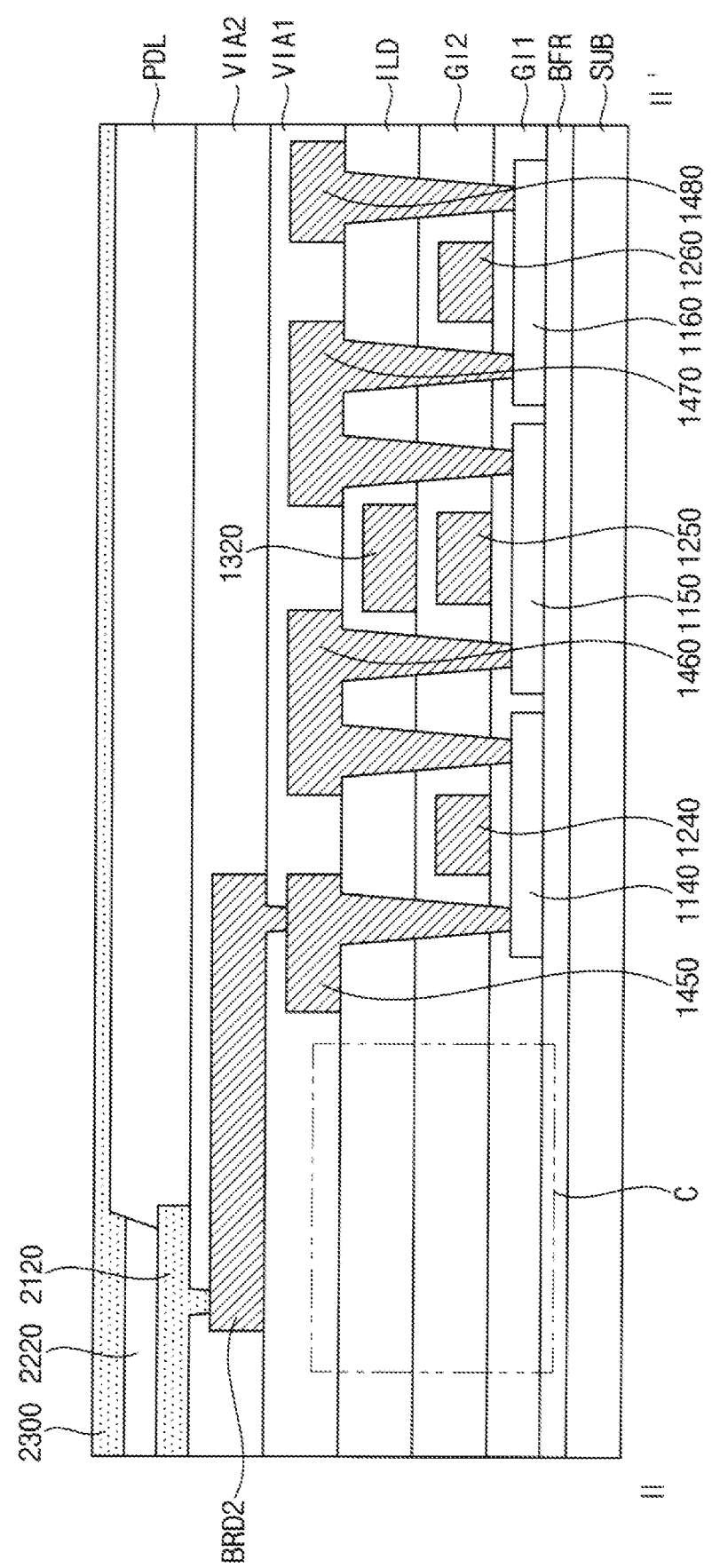
FIG. 9 is a cross-sectional view taken along the line II-II' of FIG. 6 according to some embodiments.

FIG. 8 is a cross-sectional view taken along the line I-I' of FIG. 6. FIG. 9 is a cross-sectional view taken along the line II-II' of FIG. 6. For example, FIG. 8 is a cross-sectional view illustrating the display device 10 overlapping the third display area DA3 and FIG. 9 is a cross-sectional view illustrating the display device 10 overlapping the first and second display areas DA1 and DA2.

Referring to FIGS. 2, 3, 6, and 8, FIG. 8 may be a cross-sectional view of the display device 10 overlapping the third display area DA3. The substrate SUB may include glass, quartz, plastic, or the like. According to some embodiments, the substrate SUB may include plastic, and thus the display device 10 may have a flexible characteristic. In this case, the substrate SUB may have a structure in which at least one organic film layer and at least one barrier layer are alternately stacked. For example, the organic film layer may be formed using an organic material such as polyimide, and the barrier layer may be formed using an inorganic material.

A buffer layer BFR may be located on the substrate SUB. The buffer layer BFR may prevent or reduce diffusion of metal atoms, impurities, or other contaminants from the substrate SUB into the active pattern 1100. In addition, the buffer layer BFR may control a rate of providing heat during a crystallization process for forming the active pattern 1100.

The active pattern 1100 may be located on the buffer layer BFR. For example, the active pattern 1100 may be formed of amorphous silicon, polycrystalline silicon, or oxide semiconductor.

According to some embodiments, the active pattern 1100 may include a first active pattern 1110, a second active pattern 1120, and a third active pattern 1130. The first to third active patterns 1110, 1120, and 1130 may be connected to each other.

The first gate insulating layer GI1 may cover the active pattern 1100 and may be located on the buffer layer BFR. The first gate insulating layer GI1 may include an insulating material. For example, the first gate insulating layer GI1 may include silicon oxide, silicon nitride, titanium oxide, tantalum oxide, or the like.

The first conductive pattern 1200 may be located on the first gate insulating layer GI1. The first conductive pattern 1200 may include a metal, an alloy, a conductive metal oxide, a transparent conductive material, or the like. For example, the first conductive pattern 1200 is silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Tl"), tantalum ("Ta"), platinum ("Pt"), scandium ("Sc"), indium tin oxide ("ITO"), indium zinc oxide ("IZO"), and the like.

According to some embodiments, the first conductive pattern 1200 may include a first gate electrode 1210, a second gate electrode 1220, and a third gate electrode 1230. For example, the gate line GL may correspond to at least one of the second gate electrode 1220 or the third gate electrode 1230. For example, when the first gate signal GW is provided to the gate line GL, the third gate electrode 1230 may be a part of the gate line GL. Alternatively, when the light emission control signal EM is provided to the gate line GL, the first gate electrode 1210 may be a part of the gate line GL.

According to some embodiments, the first active pattern 1110 and the first gate electrode 1210 may constitute the sixth transistor T6, the second active pattern 1120 and the second gate electrode 1220 may constitute the first transistor T1, and the third active pattern 1130 and the third gate electrode 1230 may constitute the second transistor T2.

The second gate insulating layer GI2 may cover the first conductive pattern 1200 and may be located on the first gate insulating layer GI1. The second gate insulating layer GI2 may include an insulating material.

The second conductive pattern 1300 may be located on the second gate insulating layer GI2. The second conductive pattern 1300 may include a metal, an alloy, a conductive metal oxide, a transparent conductive material, or the like.

According to some embodiments, the second conductive pattern 1300 may include a first capacitor electrode 1310. The first capacitor electrode 1310 may overlap the second gate electrode 1220 and may constitute the second gate electrode 1220 and the storage capacitor CST.

The interlayer insulating layer ILD may cover the second conductive pattern 1300 and may be located on the second gate insulating layer GI2. The interlayer insulating layer ILD may include an insulating material.

The third conductive pattern 1400 may be located on the interlayer insulating layer ILD. The third conductive pattern 1400 may include a metal, an alloy, a conductive metal oxide, a transparent conductive material, or the like.

According to some embodiments, the third conductive pattern 1400 may include a first connection line 1410, a second connection line 1420, a third connection line 1430, and a fourth connection line 1440. The first connection line 1410 may contact the first active pattern 1110, and the second connection line 1420 may contact the first and second active patterns 1110 and 1120. In addition, the third connection line 1430 may contact the second and third active patterns 1120 and 1130, and the fourth connection line 1440 may contact the third active pattern 1130.

For example, the fourth connection line 1440 may provide the data voltage DATA to the third active pattern 1130. The data voltage DATA may be transmitted to the second active pattern 1120 according to the first gate signal GW provided to the third gate electrode 1230. The driving current may be generated based on the voltage of the second gate electrode 1220 and the data voltage DATA. The driving current may be transferred to the first connection line 1410.

A first via insulating layer VIA1 may cover the third conductive pattern 1400 and may be located on the interlayer insulating layer ILD. The first via insulating layer VIA1 may include an organic insulating material. For example, the first via insulating layer VIA1 may include a photoresist, a polyacrylic resin, a polyimide resin, an acrylic resin, or the like.

The fourth conductive pattern 1500 may be located on the first via insulating layer VIA1. The fourth conductive pattern 1500 may include a metal, an alloy, a conductive metal oxide, a transparent conductive material, and the like. According to some embodiments, the fourth conductive pattern 1500 may include the first connection pad CPD1. The first connection pad CPD1 may receive the driving current.

The second via insulating layer VIA2 may cover the fourth conductive pattern 1500 and may be located on the first via insulating layer VIA1. The second via insulating layer VIA2 may include an organic insulating material.

The first electrode 2110 may be located on the second via insulating layer VIA2. The first electrode 2110 may include a metal, an alloy, a conductive metal oxide, a transparent conductive material, or the like. For example, the first electrode 2110 may have an island shape. The driving current may be provided to the first electrode 2110 through the first connection pad CPD1.

The pixel defining layer PDL may be located on the second via insulating layer VIA2. An opening exposing a part of the first electrode 2110 may be formed in the pixel defining layer PDL.

The emission layer 2220 may be located on the first electrode 2110. The emission layer 2220 may fill the opening. The emission layer 2220 may generate light having a luminance based on the amount of current of the driving current.

The second electrode 2300 may be located on the emission layer 2220. The second electrode 2300 may include a metal, an alloy, a conductive metal oxide, a transparent conductive material, or the like. For example, the second electrode 2300 may have a plate shape. The low power voltage ELVSS may be provided to the second electrode 2300.

Referring to FIGS. 2, 3, 6, and 9, the active pattern 1100 may further include fourth to sixth active patterns 1140, 1150, and 1160, the first conductive pattern 1200 may further include fourth to sixth gate electrodes 1240, 1250, and 1260, the second conductive pattern 1300 may further include a second capacitor electrode 1320, and the third conductive pattern 1400 may further include fifth to eighth connection lines 1450, 1460, 1470, and 1480. In addition, the first electrode 2120, the pixel defining layer PDL, the emission layer 2220 and the second electrode 2300 may be located on the second via insulating layer VIA2. However, the fourth to sixth active patterns 1140, 1150, and 1160, the fourth to sixth gate electrodes 1240, 1250, and 1260, the second capacitor electrode 1320, the fifth to eighth connection lines 1450, 1460, 1470, and 1480, the first electrode 2120, the pixel defining layer PDL, the emission layer 2220, and the second electrode 2300 may be substantially the same as described above with reference to FIG. 8.

The fourth conductive pattern 1500 may include the second bridge line BRD2. The second bridge line BRD2 may connect the fifth connection line 1450 and the first electrode 2120. In other words, the second bridge line BRD2 may connect the first pixel circuit portion PCP12 and the first display element DE12. The driving current may be provided to the first electrode 2120 through the second bridge line BRD2.

Meanwhile, the bridge lines may be located on the first via insulating layer VIA1. Accordingly, a dummy circuit portion may be formed using the active pattern 1100, the first conductive pattern 1200, the second conductive pattern 1300, and the third conductive pattern 1400 which overlap the bridge lines. For example, the second dummy circuit portion DCP2 may be formed using the active pattern 1100, the first conductive pattern 1200, the second conductive pattern 1300, and the third conductive pattern 1400 which overlap the second bridge line BRD2.

Figure 10:
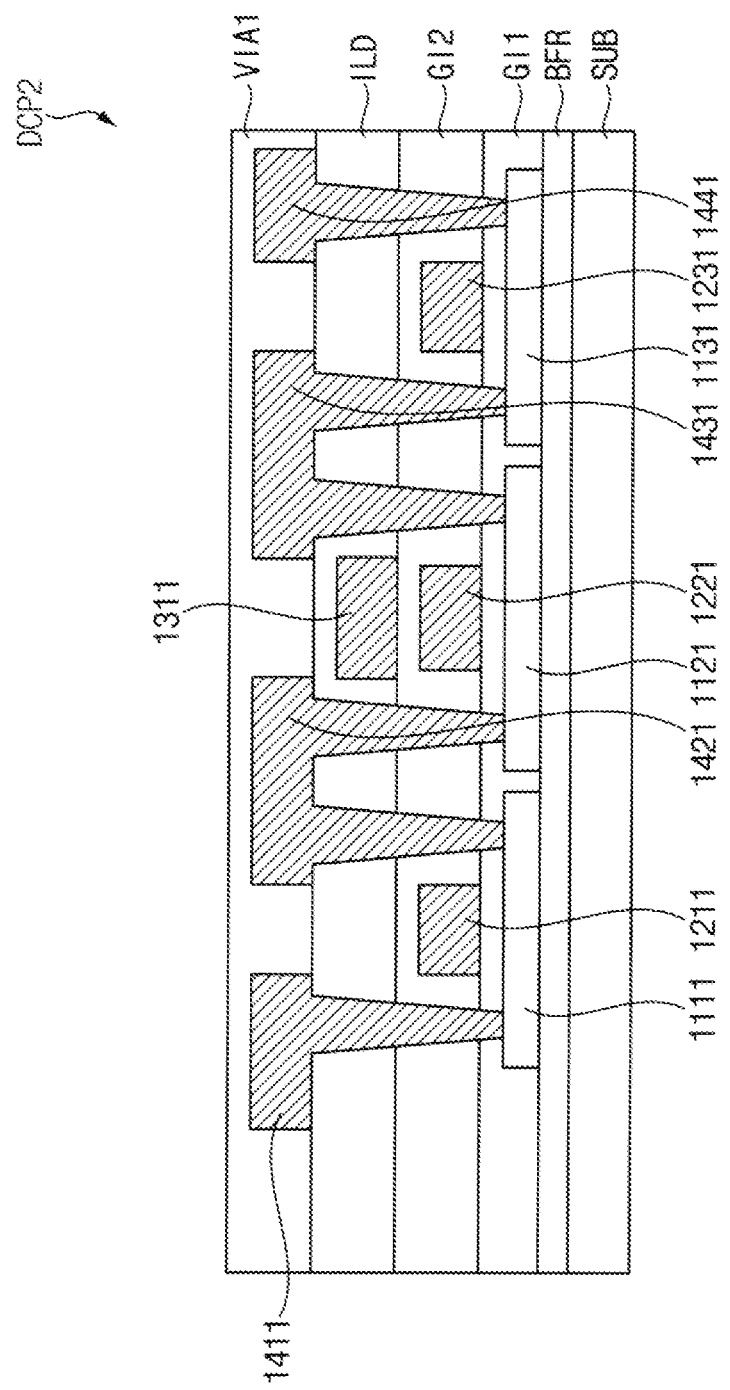
FIG. 10 is a cross-sectional view illustrating an example of a dummy circuit portion included in the display device of FIG. 1 according to some embodiments.
Figure 11:
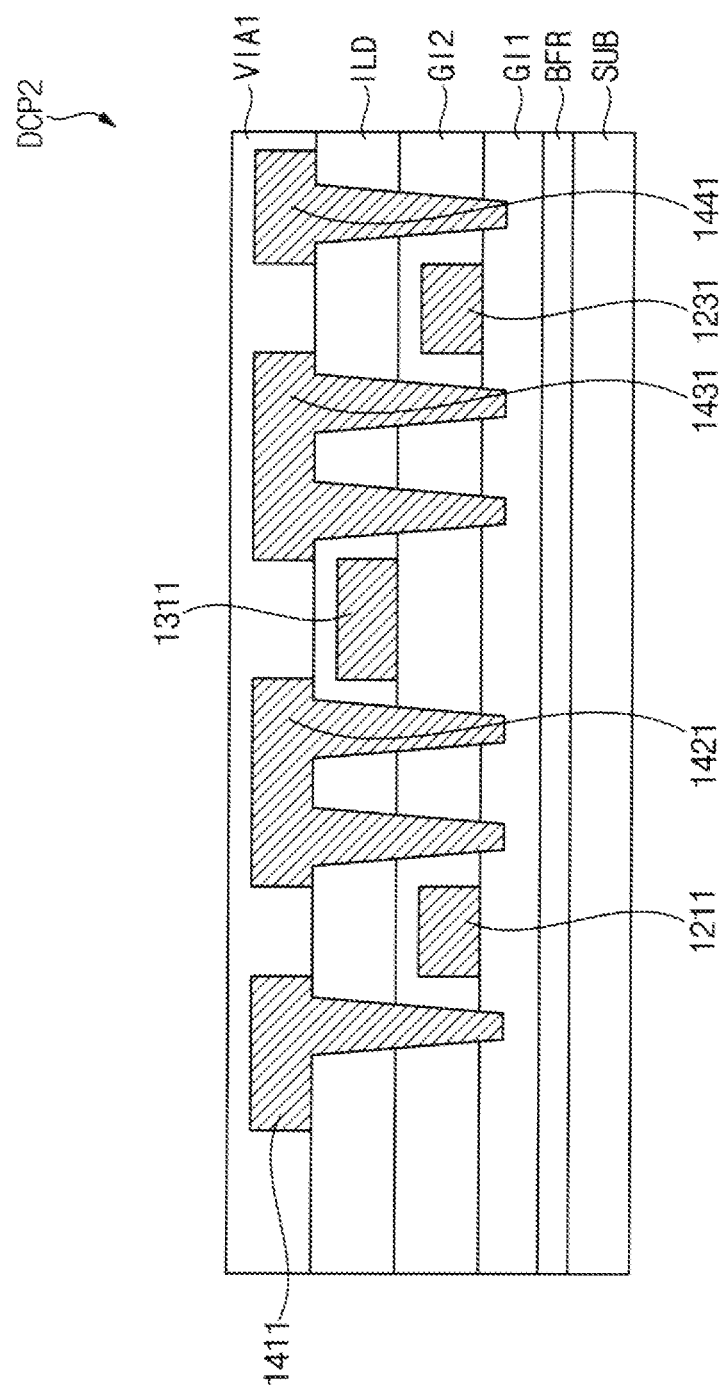
FIG. 11 is a cross-sectional view illustrating another example of a dummy circuit portion included in the display device of FIG. 1 according to some embodiments.

FIG. 10 is a cross-sectional view illustrating an example of a dummy circuit portion included in the display device of FIG. 1. FIG. 11 is a cross-sectional view illustrating another example of a dummy circuit portion included in the display device of FIG. 1. For example, FIGS. 10 and 11 may be enlarged views of region C shown in FIG. 9, and may be diagrams for explaining examples of structures of the dummy circuit portion.

Referring to FIGS. 2, 6, and 10, the second dummy circuit portion DCP2 may include the active pattern 1100, the first conductive pattern 1200, the second conductive pattern 1300, and the third conductive pattern. 1400. For example, the second dummy circuit portion DCP2 may include first to third dummy active patterns 1111, 1121, 1131, first to third dummy gate electrodes 1211, 1221, 1231, a dummy capacitor electrode 1311, and first to fourth dummy connection lines 1411, 1421, 1431, and 1441. The first to third dummy active patterns 1111, 1121, and 1131, the first to third dummy gate electrodes 1211, 1221, and 1231, the first dummy capacitor electrode 1311, and the first to fourth dummy connection lines 1411, 1421, 1431, and 1441 may be substantially corresponded to the first to third active patterns 1110, 1120, and 1130, the first to third gate electrodes 1210, 1220, 1230, the first capacitor electrode 1310, and the first to fourth connection lines 1410, 1420, 1430, and 1440 described with reference to FIG. 8. In other words, the data voltage DATA may be provided to the fourth dummy connection line 1441, and the emission control signal EM may be provided to the first dummy gate electrode 1211. The first gate signal GW may be provided to the third dummy gate electrode 1231.

The second dummy circuit portion DCP2 may not include the connection pattern and the bridge line. In other words, the second dummy circuit portion DCP2 may not be connected to the display element.

Referring to FIGS. 2, 6, and 11, the second dummy circuit portion DCP2 may include the first conductive pattern 1200, the second conductive pattern 1300, and the third conductive pattern 1400. For example, the second dummy circuit portion DCP2 may include the first and third dummy gate electrodes 1211 and 1231, a dummy capacitor electrode 1311, and first to fourth dummy connection lines 1411, 1421, 1431, and 1441. In other words, the second dummy circuit portion DCP2 may not include the first to third dummy active patterns 1111, 1211, 1131, the second dummy gate electrode 1221, the connection pattern, and the bridge line.

The display device 10 according to some embodiments of the present invention may include the pixel circuit rows PCR, the display element rows DER, and the driving circuit portions. The pixel circuit rows PCR may include the odd-numbered pixel circuit row OPC and the even-numbered pixel circuit row EPC, the odd-numbered pixel circuit row OPC may include the first pixel circuit portion PCP1 overlapping the second display area DA2 and the first dummy circuit portion DPC1 overlapping the fourth display area DA4, and the even-numbered pixel circuit row EPC may include a second dummy circuit portion DPC2 overlapping the second display area DA2 and the fourth pixel circuit portion PCP4 overlapping the fourth display area DA4. The display element rows DER may include the odd-numbered display element row ODE and the even-numbered display element row EDE, the odd-numbered display element row ODE may include the first display element DE1 overlapping the first display area DA1, and the even-numbered display element row EDE may include a sixth display element DE6 overlapping the fifth display area DA5. The first to third bridge lines BRD1, BRD2, and BRD3 may overlap the first and second display areas DA1 and DA2, may be adjacent to the even-numbered pixel circuit row EPC. The fourth to sixth bridge lines BRD4, BRD5, and BRD6 may overlap the fourth and fifth display areas DA4 and DA5 and may be adjacent to the odd-numbered pixel circuit row OPC. The driving circuit portions may include a first gate driver GDV1 overlapping the first display area DA1 and a second gate driver GDV2 overlapping the fifth display area DA5.

The first coupling phenomenon may occur on the left side of the odd-numbered pixel circuit row ODP, and the second coupling phenomenon may occur on the right side of the odd-numbered pixel circuit row ODP. In addition, the second coupling phenomenon may occur on the left side of the even-numbered pixel circuit row EVP, and the first coupling phenomenon may occur on the right side of the even-numbered pixel circuit row EVP. Accordingly, the deviation between the parasitic capacitance of the gate line GL located in the odd-numbered pixel circuit row ODP and the parasitic capacitance of the gate line GL located in the even-numbered pixel circuit row EVP may be reduced. Accordingly, a difference in luminance between the luminance of the odd-numbered pixel circuit row ODP and the luminance of the even-numbered pixel circuit row EVP may be reduced, and accordingly, a defect that is perceived by horizontal lines on the display device 10 may be improved.

In addition, the second dummy circuit portion DCP2 may be located under the first to third bridge lines BRD1, BRD2, and BRD3, and the second dummy circuit portion DCP2 may be located under the fourth to sixth bridge lines BRD4, BRD5, and BRD6. Because the first dummy circuit part DCP1 is located, the second coupling phenomenon can be suppressed. Accordingly, the deviation between the parasitic capacitance of the gate line GL located in the odd-numbered pixel circuit row ODP and the parasitic capacitance of the gate line GL located in the even-numbered pixel circuit row EVP may be further reduced.

Although certain embodiments and implementations have been described herein, other embodiments and modifications will be apparent from this description. Accordingly, the inventive concepts are not limited to such embodiments, and the scope of embodiments according to the present invention includes embodiments as defined in the appended claims and their equivalents.

What is claimed is:

1. A display device comprising:
 a substrate including a first display area, a second display area, a third display area, a fourth display area, and a fifth display area which are arranged along a row direction;
 a circuit layer on the substrate; and
 a display layer on the circuit layer,
 wherein the circuit layer comprises:
 a plurality of pixel circuit rows extending in the row direction and arranged along a column direction,
 wherein the display layer comprises:
 a plurality of display element rows extending in the row direction and arranged along the column direction,
 wherein each of odd-numbered pixel circuit rows included in the pixel circuit rows includes first pixel circuit portions overlapping the second display area, and
 wherein each of even-numbered pixel circuit rows included in the pixel circuit rows includes second pixel circuit portions overlapping the fourth display area.

2. The display device of claim 1, wherein the circuit layer further includes a first driving circuit portion overlapping the first display area, and
 each of odd-numbered display element rows included in the display element rows includes first display elements overlapping the first display area.

3. The display device of claim 2, wherein the first display elements are connected to the first pixel circuit portions through first bridge lines, respectively.

4. The display device of claim 3, wherein the first bridge lines overlaps the second display area.

5. The display device of claim 3, wherein the first bridge lines are adjacent to the even-numbered pixel circuit rows.

6. The display device of claim 3, wherein the circuit layer further includes a second driving circuit portion overlapping the fifth display area, and
 each of even-numbered display element rows included in the display element rows includes second display elements overlapping the fifth display area.

7. The display device of claim 6, wherein the second display elements are connected to the second pixel circuit portions through second bridge lines, respectively.

8. The display device of claim 7, wherein the second bridge lines overlaps the fourth display area.

9. The display device of claim 7, wherein the second bridge lines are adjacent to the odd-numbered pixel circuit rows.

10. The display device of claim 1, wherein each of the odd-numbered pixel circuit rows further includes third pixel circuit portions overlapping the third display area, and
 each of odd-numbered display element rows included in the display element rows includes third display elements overlapping the third display area.

11. The display device of claim 10, wherein the third display elements are connected to the third pixel circuit portions, respectively.

12. The display device of claim 10, wherein each of the even-numbered pixel circuit rows further includes fourth pixel circuit portions overlapping the third display area, and
 each of even-numbered display element rows included in the display element rows includes fourth display elements overlapping the third display area.

13. The display device of claim 12, wherein the fourth display elements are connected to the fourth pixel circuit portions, respectively.

14. The display device of claim 1, wherein the circuit layer further comprises a plurality of gate lines connected between a first driving circuit portion and a second driving circuit portion.

15. The display device of claim 14, wherein the gate lines provide gate signals to the pixel circuit rows.

16. The display device of claim 15, wherein the circuit layer further comprises:
 first dummy circuit portions included in each of the odd-numbered pixel circuit rows; and
 second dummy circuit portions included in each of the even-numbered pixel circuit rows.

17. The display device of claim 16, wherein the first dummy circuit portions overlap the fourth display area, and
 the second dummy circuit portions overlap the second display area.

18. The display device of claim 16, wherein the gate lines provide gate signals to the first dummy circuit portions and second dummy circuit portions.

19. A display device comprising:
 a substrate including a first display area, a second display area, and a third display area which are arranged along a row direction;
 a first pixel row on the substrate, extending in the row direction, and including first pixel circuit portions overlapping the second and third display areas;
 a second pixel row extending in the row direction and including second pixel circuit portions overlapping the third display area;
 display elements overlapping the first display area; and
 bridge lines adjacent to the second pixel row, overlapping the second display area, and connecting the first pixel circuit portions and the display elements.

20. The display device of claim 19, further comprising:
 a driving circuit portion on the substrate and overlapping the first display area,
 wherein the display elements are on the driving circuit portion.

* * * * *